United States Patent
Lim et al.

(10) Patent No.: US 6,806,135 B2
(45) Date of Patent: Oct. 19, 2004

(54) METHOD OF MANUFACTURING A SEMICONDUCTOR DEVICE USING A TWO-STEP DEPOSITION PROCESS

(75) Inventors: Hyun-Seok Lim, Suwon (KR); In-Sun Park, Suwon (KR); Sang-Bum Kang, Seoul (KR); Jong-sik Chun, Byeonggi-do (KR); Seong-Geon Park, Yongin (KR); In-Su Ha, Yongin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 10/327,902

(22) Filed: Dec. 26, 2002

(65) Prior Publication Data

US 2003/0124798 A1 Jul. 3, 2003

(30) Foreign Application Priority Data

Dec. 27, 2001 (KR) ........................................ 2001-86036

(51) Int. Cl.[7] ........................................ H01L 21/8242
(52) U.S. Cl. ........................ 438/238; 438/382; 438/648
(58) Field of Search .......................... 438/3, 238–256, 438/381–399, 648, 685

(56) References Cited

U.S. PATENT DOCUMENTS

| 6,238,964 B1 * | 5/2001 | Cho ............................ 438/240 |
| 6,365,495 B2 * | 4/2002 | Wang et al. ................. 438/582 |
| 6,548,402 B2 * | 4/2003 | Wang et al. ................. 438/680 |

* cited by examiner

Primary Examiner—H. Jey Tsai
(74) Attorney, Agent, or Firm—Lee & Sterba, P.C.

(57) ABSTRACT

The present invention discloses a method of manufacturing a semiconductor device having an upper capacitor electrode and a node resistor, including depositing a thin film at a first deposition rate on an edge portion of a wafer and at a second deposition rate on a central portion of the wafer to form the upper capacitor electrode and the node resistor, thereby improving step coverage of the upper capacitor electrode while simultaneously improving resistance distribution of the node resistor.

17 Claims, 8 Drawing Sheets

METHOD OF MANUFACTURING A SEMICONDUCTOR DEVICE USING A TWO-STEP DEPOSITION PROCESS

BACKGROUND OF THE INVENTION

1. Field of the Invention

The present invention relates to a method of manufacturing a semiconductor device. More particularly, the present invention relates to a method of depositing a titanium nitride layer using a two-step deposition process, which can improve step coverage of an upper capacitor electrode of a capacitor while simultaneously improving resistance distribution of a node resistor.

2. Description of the Related Art

FIG. 1 illustrates a cross-sectional view of a conventional dynamic random access memory (DRAM) device. A semiconductor substrate 100 includes a cell region 110 and a peripheral region 115.

A MOS transistor is formed on an active region of the cell region defined by a device isolation film 121. The MOS transistor includes a gate oxide layer 123, a gate electrode 124 and doped regions 126 for source and drain electrodes.

A bit line 128 is connected to one of the doped regions 126 via a contact 134. A capacitor is formed on an insulating layer 130. The capacitor includes a lower capacitor electrode 140, which is a storage node connected to a doped region 126, which is not in contact with a bit line 128, via a contact 132, a dielectric layer 150 and an upper capacitor electrode 161. A node resistor 163 is formed on a portion of the insulating layer 130 over the peripheral region 115.

In order to form the upper capacitor electrode 161 and the node resistor 163, a titanium nitride layer 160 is deposited using an atomic layer deposition. In this case, the upper capacitor electrode 161 and the node resistor 163 require different deposition conditions.

In other words, the titanium nitride layer used as the upper capacitor electrode 161 is required to have excellent step coverage in order to obtain excellent electrical characteristics with respect to leakage current, capacitance and a high time dependent dielectric breakdown (TDDB). However, the titanium nitride layer used as the node resistor 163 is required to have uniformity that is optimized for a resultant device. In order to obtain optimized uniformity, the titanium nitride layer should have an optimized resistance distribution. An optimized resistance distribution is preferable because when a resistance distribution of the node resistor 163 is large, a possibility of deviating from a range of desired resistance values is increased. Deviation from the range of desired resistance values results in abnormal operation, thereby lowering manufacturing yield.

However, since a deposition condition of the titanium nitride layer for obtaining excellent step coverage conflicts with a deposition condition of the titanium nitride layer for obtaining an optimized resistance distribution, a conventional method of depositing the titanium nitride layer using atomic layer deposition cannot satisfy the two deposition conditions simultaneously.

In order to obtain excellent step coverage, the titanium nitride layer should be deposited in a condition wherein a ratio of $NH_3$ to $TiCl_4$ is low, whereas, to improve the resistance distribution, the titanium nitride layer should be deposited in a condition wherein a ratio of $NH_3$ to $TiCl_4$ is high.

FIG. 2 is a photograph illustrating step coverage of a titanium nitride layer deposited by conventional atomic layer deposition. An upper photograph of FIG. 2 illustrates step coverage of a portion of the titanium nitride layer corresponding to an upper portion of the capacitor. A lower photograph of FIG. 2 illustrates step coverage of a portion of the titanium nitride layer corresponding to a lower portion of the capacitor.

Referring to FIG. 2, when a ratio of $NH_3$ to $TiCl_4$ is 16.7, the portion of the titanium nitride layer corresponding to the upper portion of the capacitor is deposited to a thickness of 150 Å, while the portion of the titanium nitride layer corresponding to the lower portion of the capacitor is deposited to a thickness of 30 Å. That is, it may be understood that the step coverage is inferior when a ratio of $NH_3$ to $TiCl_4$ is high.

FIGS. 3 and 4 are photographs illustrating resistance distribution and deposition thickness of a titanium nitride layer deposited using conventional atomic layer deposition.

When the titanium nitride layer is deposited on a patterned wafer by conventional atomic layer deposition, thickness of the titanium nitride layer varies at different locations of the wafer. This variance occurs because there exists a loading effect that is dependent upon pattern density. Since the pattern density varies at different locations of the wafer, the loading effect also varies, and the thickness of the titanium nitride layer deposited on the patterned wafer is not uniform.

For example, a titanium nitride layer may be deposited on a bare, unpatterned wafer to a uniform thickness of 320 Å. If a titanium nitride layer is deposited under the same deposition conditions on a patterned wafer, however, a thickness of a portion of the titanium nitride layer corresponding to a central portion of the patterned wafer is 160 Å, whereas a thickness of a portion of the titanium nitride layer corresponding to an edge portion of the patterned wafer is 195 Å, as shown in FIG. 4. In this case, the portion of the titanium nitride layer corresponding to the central portion of the wafer has a resistance value of 3239 Ω, whereas the portion of the titanium nitride layer corresponding to the edge portion of the wafer has a resistance value of 2986 Ω. Consequently, the resistance distribution of the titanium nitride layer formed on the patterned wafer is not uniform.

Referring to FIG. 4, it may be understood that since a central portion and an edge portion of the wafer differ in loading effects, the portion of the titanium nitride layer formed on the central portion of the wafer is thinner than the portion of the titanium nitride layer formed on the edge portion of the wafer.

Table 1 shows a loading effect and a thickness of a titanium nitride layer according to a location on a bare, unpatterned wafer and a patterned wafer.

TABLE 1

|  | A-thickness | B-thickness | Loading effect |
| --- | --- | --- | --- |
| Top portion (T) | 650 Å | 393 Å | 60.5% |
| Central portion (C) | 650 Å | 322 Å | 49.5% |
| Bottom portion (B) | 650 Å | 409 Å | 62.9% |
| Left portion (L) | 650 Å | 397 Å | 61.1% |
| Right portion (R) | 650 Å | 395 Å | 60.8% |

In Table 1, "A-thickness" denotes a thickness of a titanium nitride layer formed on a bare wafer, and "B-thickness" denotes a thickness of a titanium nitride layer formed on a patterned wafer. Here, the titanium nitride layers are deposited under identical conditions.

As set forth in Table 1, the titanium nitride layer formed on the bare wafer has a uniform thickness regardless of a location on the wafer, while the titanium nitride layer formed on the patterned wafer has a non-uniform thickness. Specifically, a portion of the titanium nitride layer formed on the central portion of the wafer is thinner than a portion of the titanium nitride layer formed on the edge portion of the wafer. As a result, since the thickness of the titanium nitride layer varies depending on location on the wafer, the resistance distribution of the node resistor is non-uniform.

SUMMARY OF THE INVENTION

In an effort to overcome the problems described above, it is a feature of an embodiment of the present invention to provide a method of forming a titanium nitride layer which can improve step coverage of an upper capacitor electrode while simultaneously improving resistance distribution of a node resistor.

In order to provide this feature, a preferred embodiment of the present invention provides a method of manufacturing a semiconductor device having an upper capacitor electrode and a node resistor, including depositing a thin film at a first deposition rate on an edge portion of a wafer and at a second deposition rate on a central portion of a wafer to form the upper capacitor electrode and the node resistor. Preferably, the thin film is a titanium nitride layer.

Preferably, a portion of the thin film corresponding to the central portion of the wafer is deposited to a thickness greater than a thickness of a portion of the thin film corresponding to the edge portion of the wafer.

The non-uniform deposition thickness may be achieved by depositing the thin film in multiple layers and under variable deposition conditions. Specifically, depositing the thin film may include depositing a first thin film at a constant deposition rate on both the edge portion and the central portion of the wafer, and depositing a second thin film at a deposition rate to the edge portion of the wafer that is smaller than a deposition rate to the central portion of the wafer. Also, the second thin film may be deposited at a higher deposition pressure than the first thin film.

Preferably, the first thin film is deposited under a deposition condition wherein a ratio of $NH_3$ to $TiCl_4$ is relatively low, e.g., less than about 3.3, and the second thin film is deposited under a deposition condition wherein a ratio of $NH_3$ to $TiCl_4$ is relatively high, e.g., greater than about 16.7. In addition, a distance for a deposition gas to reach a central portion of the wafer may be longer than a distance for the deposition gas to reach an edge portion of the wafer.

The first thin film may be deposited to a thickness that is between about 50% to 90% of a total thickness of the thin film, and the second thin film may be deposited to a thickness that is between about 10% to 50% of the total thickness of the thin film.

The thin film may be deposited by atomic layer deposition or chemical vapor deposition.

According to another embodiment of the present invention, a method of manufacturing a semiconductor device is provided, including depositing a first titanium nitride layer under a deposition condition that promotes excellent step coverage and depositing a second titanium nitride layer under a deposition condition that promotes uniform resistance distribution.

BRIEF DESCRIPTION OF THE DRAWINGS

The above features and advantages of the present invention will become readily apparent to those of ordinary skill in the art by describing in detail preferred embodiments thereof with reference to the attached drawings in which.

DETAILED DESCRIPTION OF THE INVENTION

Figure 1:
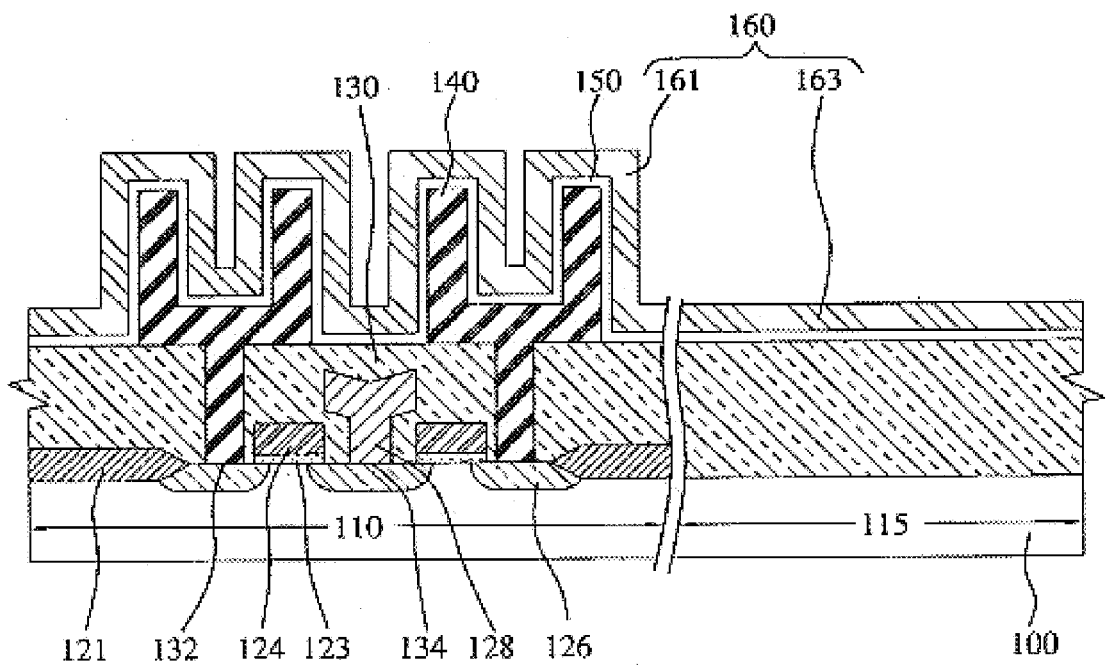
FIG. 1 illustrates a cross-sectional view of a conventional dynamic random access memory (DRAM) device.
Figure 2:
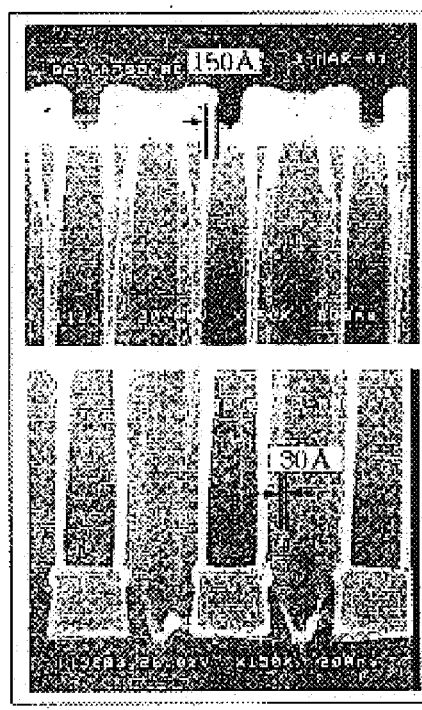
FIG. 2 is a photograph illustrating step coverage of a titanium nitride layer deposited by conventional atomic layer deposition.
Figure 3:
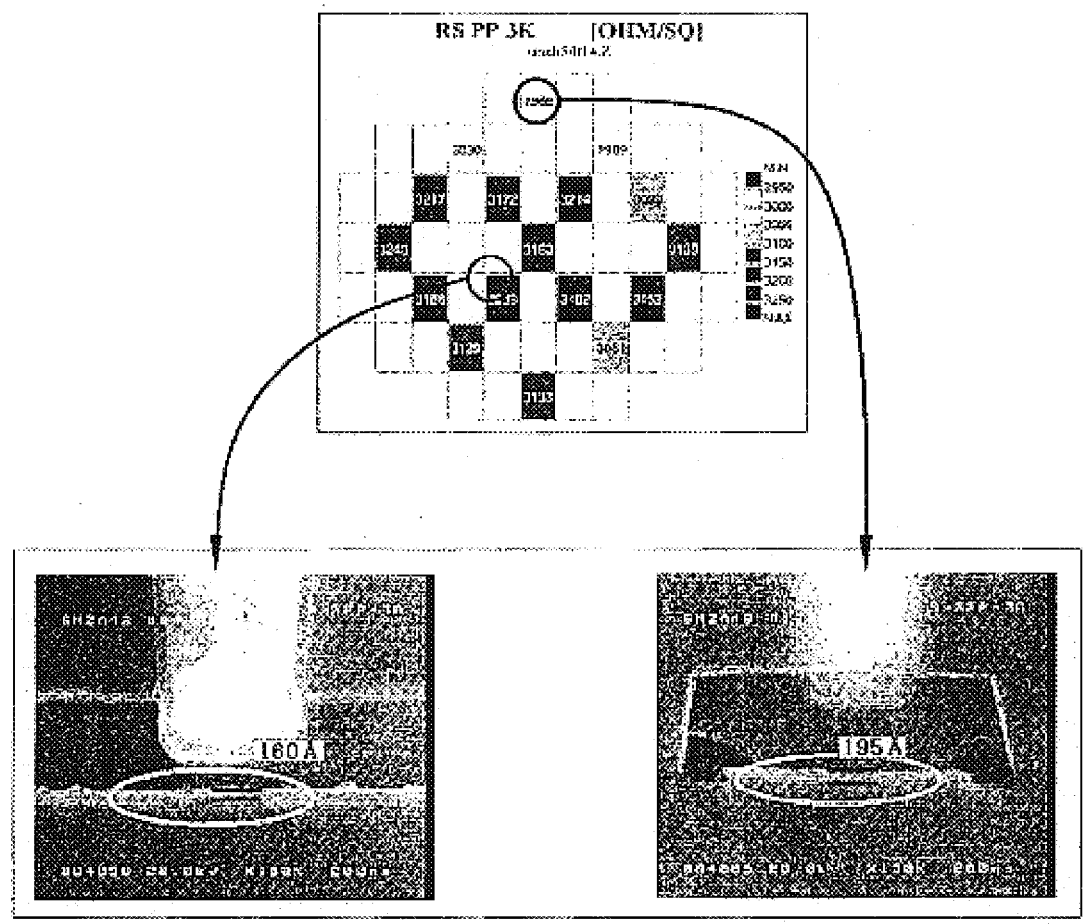
FIGS. 3 and 4 are photographs illustrating a resistance distribution and a deposition thickness of a titanium nitride layer when the titanium nitride layer is deposited using conventional atomic layer deposition.
Figure 4:
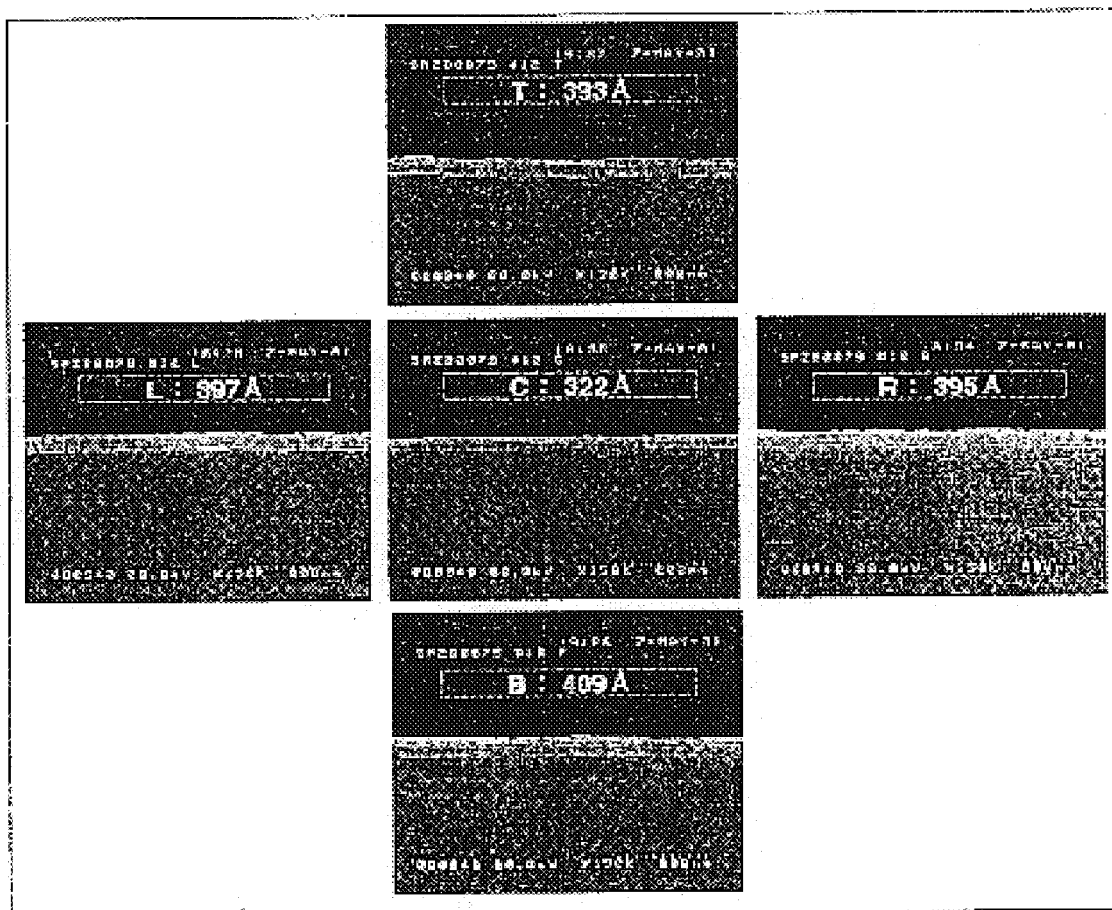

Korean Patent Application No. 2001-86036, filed on Dec. 27, 2001, and entitled: "Method of Manufacturing Semiconductor Device Using Two-Step Deposition," is incorporated by reference herein in its entirety.

Hereinafter, the present invention will be described in detail by describing preferred embodiments of the present invention with reference to the accompanying drawings. Like reference numerals refer to like elements throughout the drawings. In the drawings, the shape and thickness of an element may be exaggerated for clarity and convenience. Further, it will be understood that when a layer is referred to as being on another layer or "on" a substrate, it may be directly on the other layer or on the substrate, or intervening layers may also be present.

Figure 5:
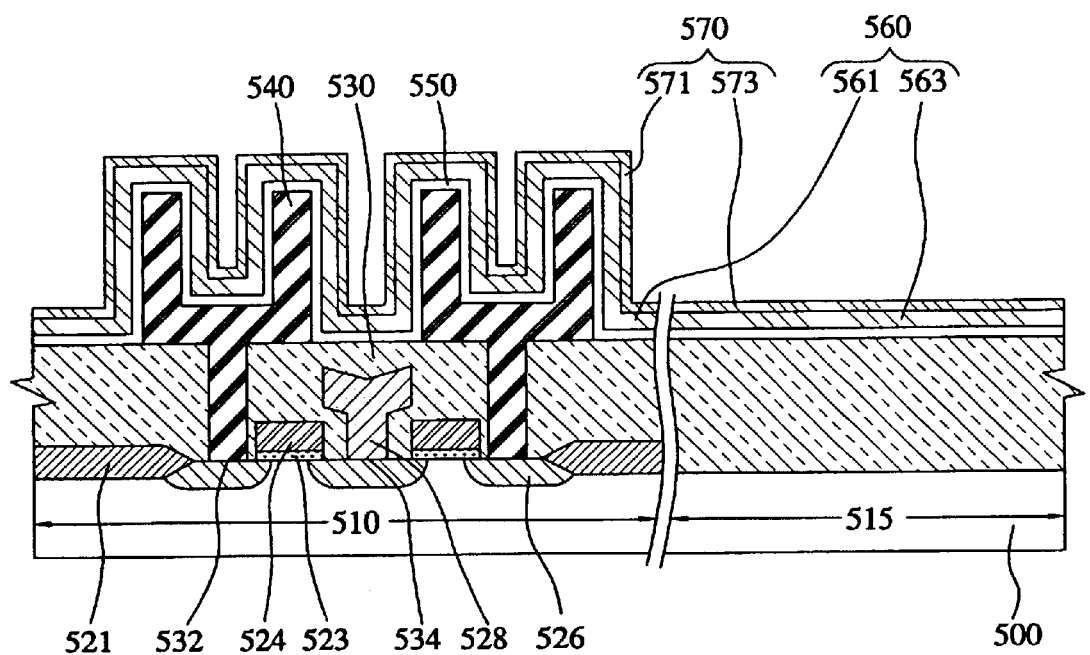
FIG. 5 illustrates a cross-sectional view of a semiconductor memory device according to an embodiment of the present invention.

FIG. 5 illustrates a cross-sectional view of a semiconductor memory device according to the present invention.

A semiconductor substrate 500 includes a cell region 510 and a peripheral region 515. A MOS transistor is formed on an active region of the cell region defined by a device isolation film 521. The MOS transistor includes a gate oxide layer 523, a gate electrode 524 and doped regions 526 for source and drain electrodes.

A bit line 528 is connected to one of the doped regions 526 via a contact 534. An insulating layer 530 is formed over an entire surface of the substrate 500. A capacitor is formed on a portion of the insulating layer 530 over the cell region 510. The capacitor includes a lower capacitor electrode 540, which is a storage node connected to a doped region 526, which is not in contact with a bit line 528, via a contact 532, a dielectric layer 550 and an upper capacitor electrode including two layers 561 and 571. A node resistor including two layers 563 and 573 is formed on a portion of the insulating layer 530 over the peripheral region 515.

The upper capacitor electrode and the node resistor are made of a titanium nitride layer using a novel two-step atomic layer deposition process. In a first step of the atomic layer deposition process, a first titanium nitride layer 560 is deposited under deposition conditions conducive to forming the upper capacitor electrode having excellent step coverage. In a second step of the atomic layer deposition process, a second titanium nitride layer 570 is deposited under deposition conditions conducive to forming the node resistor having a uniform resistance distribution.

Layers 561 and 571 of the first and second titanium nitride layers 560 and 570, respectively, formed over the cell region 510 serve as the upper capacitor electrode. Layers 563 and 573 of the first and second titanium nitride layers 560 and 570, respectively, formed over the peripheral region 510 serve as the node resistor.

A method of forming the titanium nitride layer using the two-step atomic layer deposition process according to the present invention will now be described.

A purpose of the first step of the two-step atomic layer deposition process is to improve step coverage of the upper capacitor electrode. Improved step coverage is necessary because as a size of a memory device decreases, a structure of a capacitor becomes increasingly complicated. To obtain a desired capacitance, a capacitor electrode having an aspect ratio of greater than 10 requires a titanium nitride layer to have excellent step coverage.

For a one cylinder storage (OCS) capacitor electrode structure, a portion of a titanium nitride layer corresponding to a bottom portion of the capacitor should be deposited to a thickness greater than a minimum thickness to prevent a reaction from occurring between a dielectric layer and a polysilicon layer for a plate formed over the titanium nitride layer.

For example, if the minimum thickness of a titanium nitride layer that can prevent such a reaction is about 80 Å, and assuming a loading effect is 40% and step coverage is 80%, then the titanium nitride layer deposited on a bare wafer should have a thickness of at least 250 Å.

The thickness of a deposited titanium nitride layer may depend on step coverage, and step coverage greatly depends on a ratio of $NH_3$ to $TiCl_4$. For example, a ratio of $NH_3$ to $TiCl_4$ of less than about 3.3 corresponds to step coverage of greater than about 80%.

In the first step of the two-step atomic layer deposition process, a deposition condition used to obtain excellent step coverage is a relatively low ratio of $NH_3$ to $TiCl_4$, preferably, less than about 3.3.

A purpose of the second step in the two-step atomic layer deposition process is to improve a resistance distribution of the node resistor.

Uniform resistance distribution in a node resistor may be achieved if a titanium nitride layer is deposited to a thickness of 20 Å thicker on a central portion of a patterned wafer than on an edge portion of the patterned wafer. This result occurs because when a titanium nitride layer is deposited on a patterned wafer having greater pattern density than a bare wafer, a loading effect exists such that a thickness of a portion of the titanium nitride layer corresponding to a central portion of the patterned wafer becomes thinner.

Typically, the loading effect occurring on a patterned wafer depends on pattern density. When a titanium nitride layer is deposited on a bare wafer and a patterned wafer under identical and uniform deposition conditions, if the thickness of the titanium nitride layer actually formed on the bare wafer is 100 Å, then the thickness of the titanium nitride layer actually formed on the patterned wafer is variable, with a portion of the titanium nitride layer corresponding to a central portion of the patterned wafer having a thickness in a range of between about 40 Å and 70 Å. That is, the loading effect of the titanium nitride layer deposited by atomic layer deposition on the patterned wafer is in a range of between about 40% and 70%. Here, the loading effect has a stronger power of influence in the central portion of the patterned wafer than the edge portion of the patterned wafer due to characteristics of a hard wafer and gas flow of atomic layer deposition equipment used to deposit the titanium nitride layer.

Therefore, considering that loading effects differ at different locations of a wafer according to pattern density, the second step of the atomic layer deposition process is performed such that a portion of a second titanium nitride layer corresponding to the central portion of the wafer is deposited with a thickness thicker than a portion of the second titanium nitride layer corresponding to the edge portion of the wafer. At this time, the second step is performed under a deposition condition wherein a ratio of $NH_3$ to $TiCl_4$ is relatively high, preferably, greater than about 16.7. As a result, the deposited titanium nitride layer has a uniform thickness thereby improving the resistance distribution of the node resistor.

As described above, the first titanium nitride layer 560 is deposited at a uniform deposition rate to the entire wafer, and the second titanium nitride layer 570 is deposited at a higher deposition rate on the central portion of the wafer than on the edge portion of the wafer. By performing the deposition in this manner, it is possible to improve both step coverage and resistance distribution of the titanium nitride layer.

Preferably, the first titanium nitride layer 560 is deposited to a thickness that is between about 50% to 90% of a total thickness of the titanium nitride layer, and the second titanium nitride layer 570 is deposited to a thickness that is between about 10% to 50% of a total thickness of the titanium nitride layer.

In an exemplary case, a total thickness of the titanium nitride layer may be 320 Å. Accordingly, in the first step of the two-step atomic layer deposition process, the first titanium nitride layer is deposited to a thickness of 250 Å, and in the second step of the two-step atomic layer deposition process, the second titanium nitride layer is deposited to a thickness of 100 Å. Taking into consideration a loading effect, the second titanium nitride layer 570 is deposited under a deposition condition wherein a ratio of $NH_3$ to $TiCl_4$ is greater than about 16.7 so that the second titanium nitride layer 570 is deposited with a thickness between about 20 Å to 40 Å thicker at a central portion of the wafer than at an edge portion of the wafer.

A method of forming the titanium nitride layer according to the present invention has been described focusing on a two-step atomic layer deposition process, but may also be achieved using a two-step chemical vapor deposition process.

As previously described, a uniform resistance distribution in the second titanium nitride layer 570 may be achieved by adjusting a ratio of $NH_3$ to $TiCl_4$ used in the deposition thereof. However, the second titanium nitride layer 570 may also be deposited to have a uniform resistance distribution by modifying a mechanism of deposition equipment.

Figure 6:
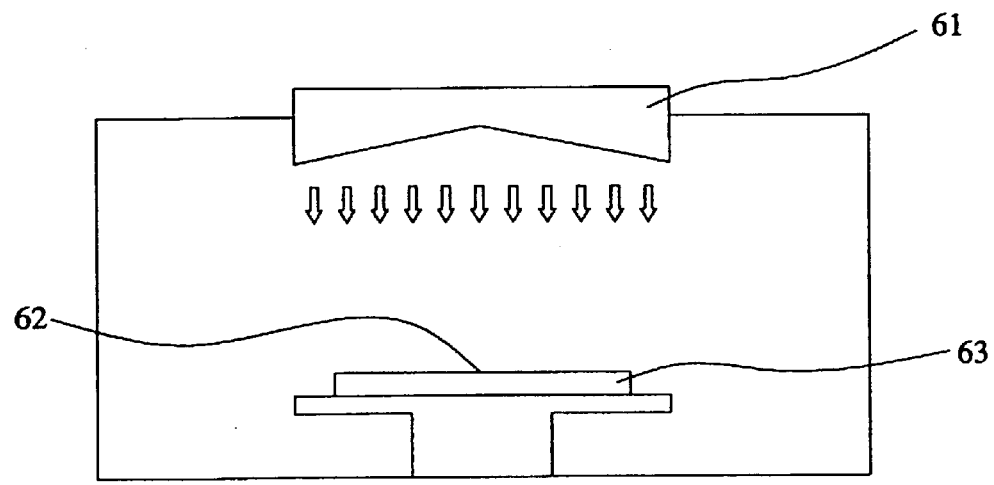
FIG. 6 illustrates an exemplary drawing of a two-step deposition process according to an embodiment of the present invention.

For example, FIG. 6 shows an exemplary drawing of a two-step deposition process according to an embodiment of the present invention. As shown in FIG. 6, the deposition equipment may be designed so that a distance between a showerhead 61 and a central portion of a wafer 62 differs from a distance between the showerhead 61 and an edge portion of the wafer 63.

Alternatively, the deposition equipment may be designed to provide different deposition pressures to the central portion of the wafer 62 and the edge portion of the wafer 63. For example, the first titanium nitride layer may be deposited at a deposition pressure of about 5 torr, and the second titanium nitride layer may be deposited at a deposition pressure of between about 7 torr and 10 torr, thereby improving resistance distribution.

Figure 7:
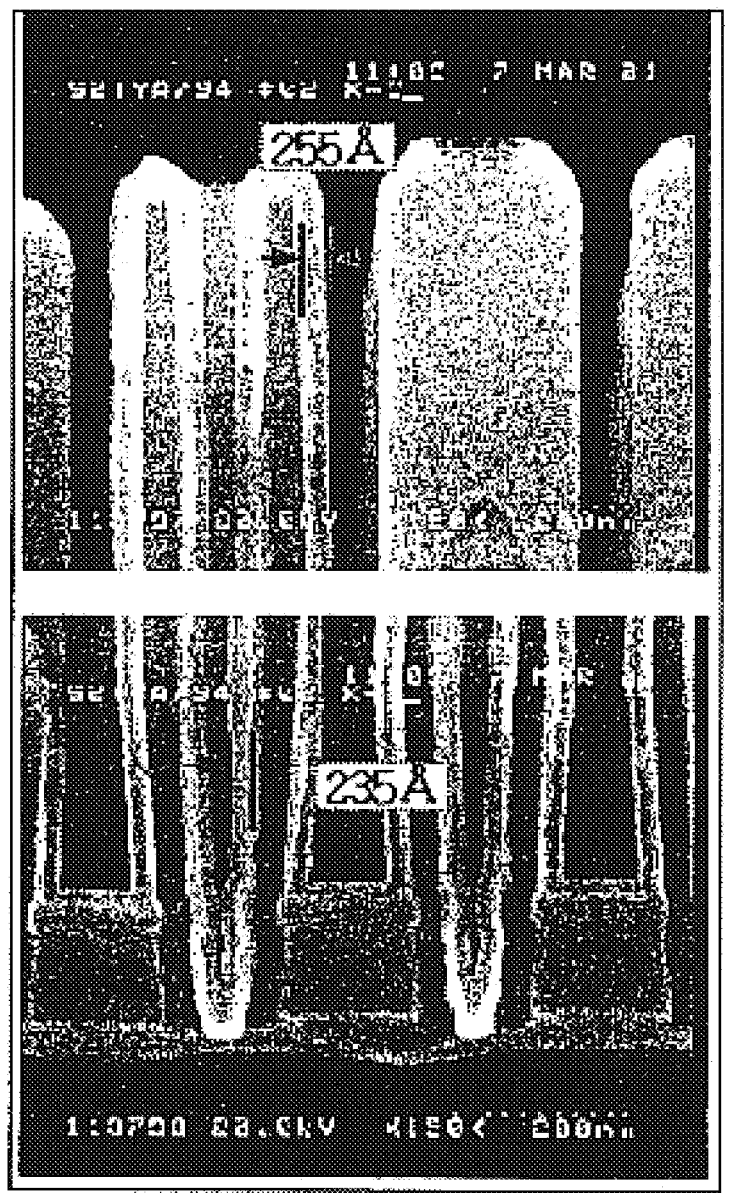
FIG. 7 is a photograph illustrating step coverage of a titanium nitride layer deposited by a two-step deposition process according to an embodiment of the present invention.

FIG. 7 shows a photograph illustrating step coverage of the first titanium nitride layer deposited by the first step of the two-step atomic layer deposition process according to the present invention, under a deposition condition wherein a ratio of $NH_3$ to $TiCl_4$ is about 3.3. As shown in FIG. 7, the upper capacitor electrode has excellent step coverage.

Figure 8:
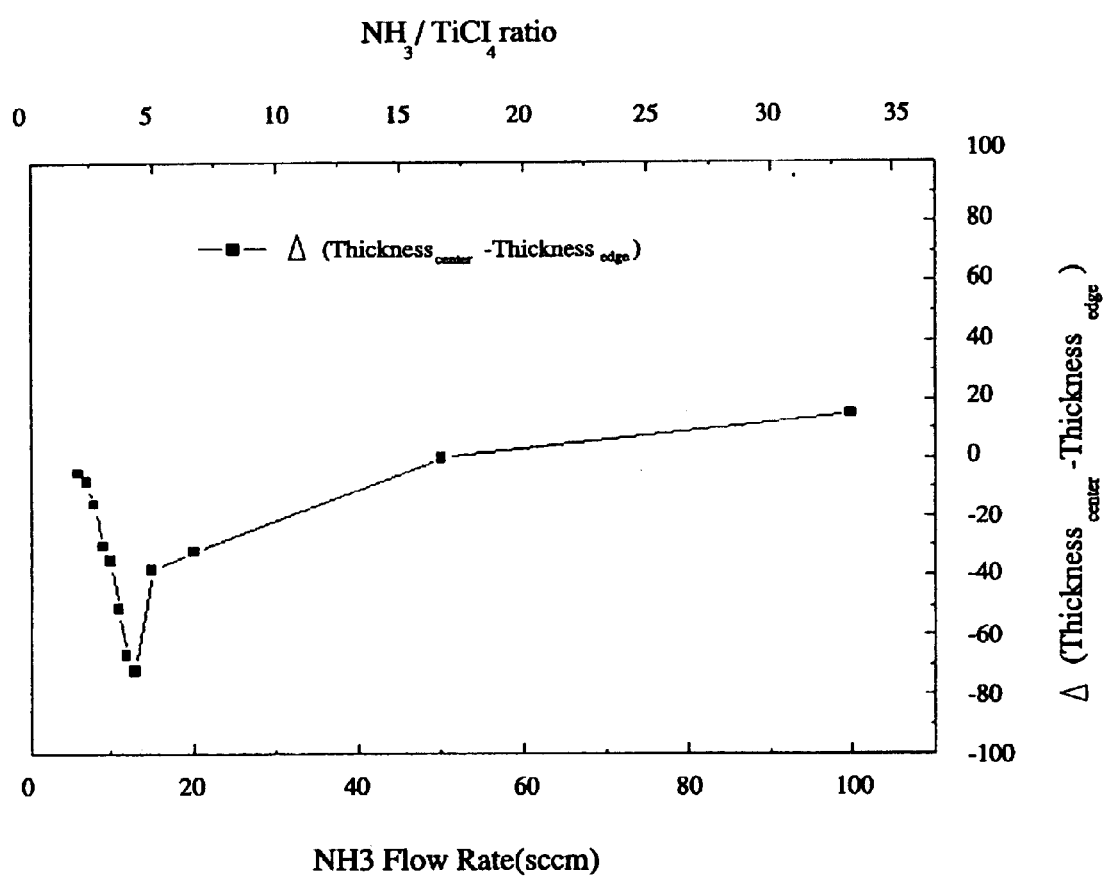
FIG. 8 illustrates a graph showing a difference in thickness between a portion of a titanium nitride layer corresponding to a central portion of a wafer and a portion of a titanium nitride layer corresponding to an edge portion of the wafer.

FIG. 8 illustrates a graph showing a difference in thickness between a portion of the second titanium nitride layer corresponding to a central portion of a wafer and a portion of the second titanium nitride layer corresponding to an edge portion of the wafer when the second titanium nitride layer is deposited under various deposition conditions in the second step of the two-step atomic layer deposition process according to the present invention. In order for the second titanium nitride layer deposited on the central portion of the wafer to be thicker than the second titanium nitride layer deposited on the edge portion of the wafer, a ratio of $NH_3$ to $TiCl_4$ less than about 3.3 or greater than about 16.7 is necessary. However, since a deposition rate is low and a specific resistance is high when a ratio of $NH_3$ to $TiCl_4$ is less than about 3.3, it is preferable to deposit the second titanium nitride layer under a deposition condition wherein a ratio of $NH_3$ to $TiCl_4$ is greater than about 16.7. This results in improving thickness uniformity of the titanium nitride layer, thereby improving resistance distribution.

Figure 9A:
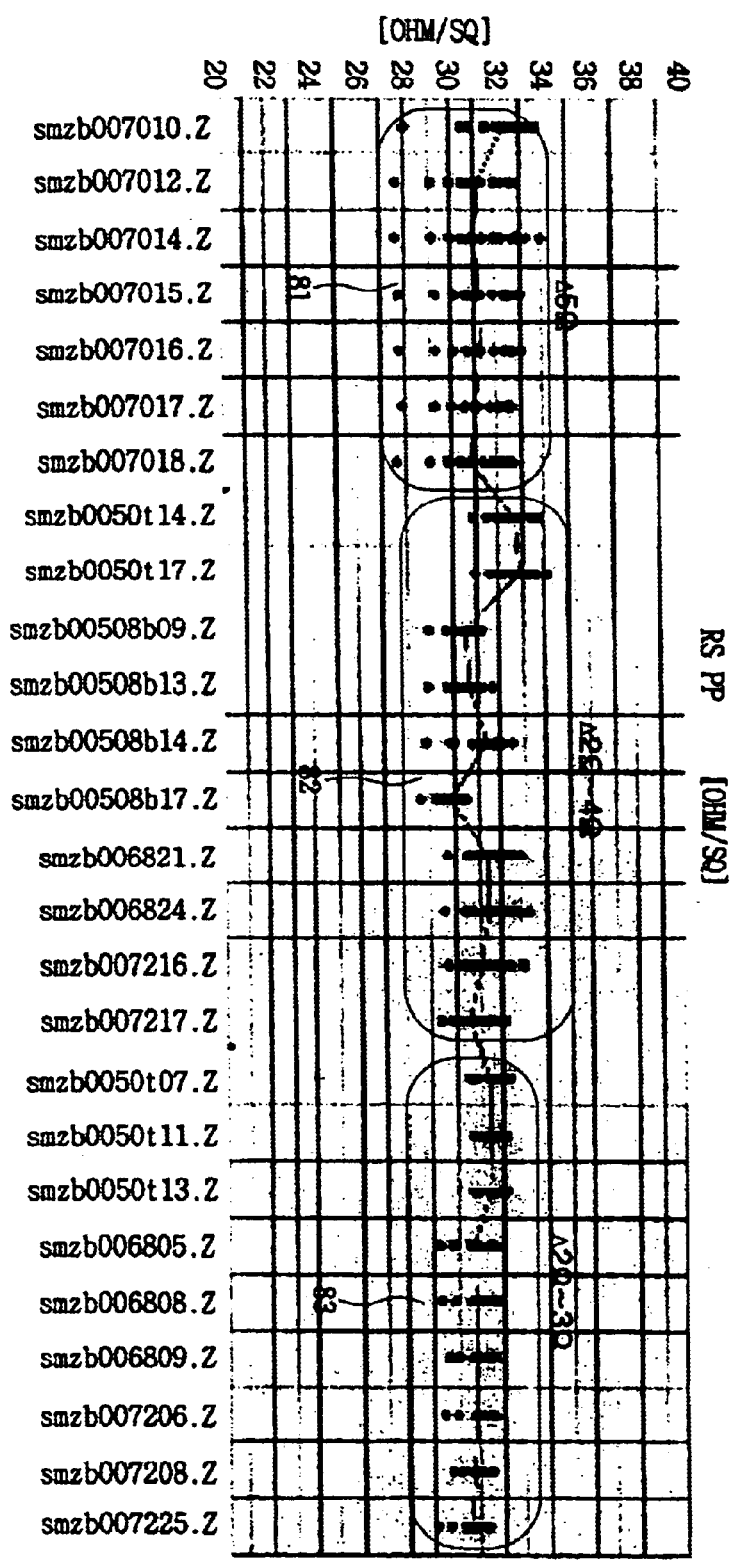
FIGS. 9A and 9B show a resistance distribution of a titanium nitride layer deposited using a two-step atomic layer deposition process according to an embodiment of the present invention as compared to that of a titanium nitride layer deposited using conventional atomic layer deposition.
Figure 9B:
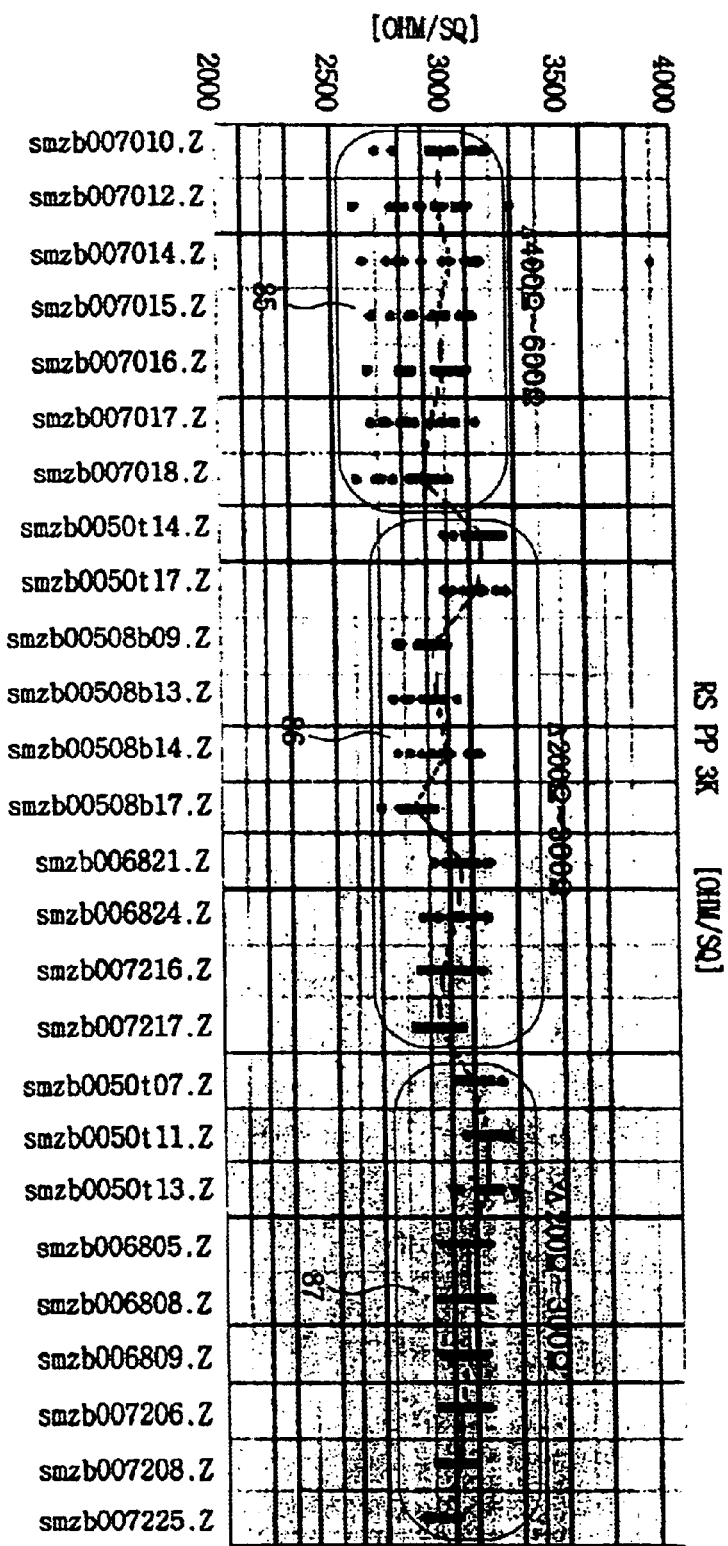

FIGS. 9A and 9B show resistance distribution of a titanium nitride layer deposited using the two-step atomic layer deposition process of the present invention and using a conventional atomic layer deposition process according to the prior art. In particular, FIGS. 9A and 9B show resistance distribution of the titanium nitride layers having a node resistance of 30 Ω and 300 Ω, respectively. In comparison to titanium nitride layers 81 and 85 deposited by conventional atomic layer deposition, titanium nitride layers 82, 86, 83, and 87 deposited by the two-step atomic layer deposition process according to the present invention or the two-step chemical vapor deposition process according to the present invention show a significantly improved resistance distribution.

In FIG. 9A, a resistance distribution of the conventional titanium nitride layer (81) is 5 Ω, while a resistance distribution of the titanium nitride layers (82, 83) deposited according to the present invention is 2–3 Ω. Also, in FIG. 9B, similar to FIG. 9A, a resistance distribution of the conventional titanium nitride layer (85) is 400–600 Ω, while a resistance distribution of the titanium layers (82, 83) deposited according to the present invention is 200–300 Ω.

As described herein, the method of forming a titanium nitride layer according to the present invention provides improved step coverage of an upper capacitor electrode while simultaneously improving resistance distribution of a node resistor.

Preferred embodiments of the present invention have been disclosed herein and, although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A method of manufacturing a semiconductor device having an upper capacitor electrode and a node resistor comprising:
    depositing a thin film at a first deposition rate on an edge portion of a wafer and at a second deposition rate on a central portion of the wafer to form the upper capacitor electrode and the node resistor,
    wherein a portion of the thin film corresponding to the central portion of the wafer is deposited to a thickness greater than a thickness of a portion of the thin film corresponding to the edge portion of the wafer.

2. The method as claimed in claim 1, wherein the thin film is a titanium nitride layer.

3. The method as claimed in claim 1, wherein depositing the thin film comprises:
    depositing a first thin film at a deposition rate on the edge portion of the wafer and at an identical deposition rate on the central portion of the wafer; and
    depositing a second thin film at the first deposition rate to the edge portion of the wafer and at the second deposition rate to the central portion of the wafer, wherein the first deposition rate is smaller than the second deposition rate.

4. The method as claimed in claim 3, wherein the first thin film is deposited under a deposition condition wherein a ratio of $NH_3$ to $TiCl_4$ is relatively low, and the second thin film is deposited under a deposition condition wherein a ratio of $NH_3$ to $TiCl_4$ is relatively high.

5. The method as claimed in claim 4, wherein the ratio of $NH_3$ to $TiCl_4$ in depositing the first thin film is less than about 3.3, and the ratio of $NH_3$ to $TiCl_4$ in depositing the second thin film is greater than about 16.7.

6. The method as claimed in claim 3, wherein the second thin film is deposited at a higher deposition pressure than the first thin film.

7. The method as claimed in claim 3, wherein a distance for a deposition gas from a showerhead to reach a central portion of the wafer is longer than a distance for the deposition gas to reach an edge portion of the wafer.

8. The method as claimed in claim 3, wherein the first thin film is deposited to a thickness that is between about 50% to 90% of a total thickness of the thin film, and the second thin film is deposited to a thickness that is between about 10% to 50% of the total thickness of the thin film.

9. The method as claimed in claim 1, wherein the thin film is deposited by atomic layer deposition or chemical vapor deposition.

10. A method of manufacturing a semiconductor device comprising:
    depositing a first titanium nitride layer under a deposition condition that promotes excellent step coverage; and
    depositing a second titanium nitride layer under a deposition condition that promotes uniform resistance distributions,
    wherein the second titanium nitride layer is deposited under a deposition condition so that a portion of the second titanium nitride layer corresponding to a central portion of a wafer is deposited to a thickness greater than a portion of the second titanium nitride layer corresponding to an edge portion of a wafer.

11. The method as claimed in claim 10, wherein the first titanium nitride layer is deposited under a deposition condition wherein a ratio of $NH_3$ to $TiCl_4$ is less than about 3.3.

12. The method as claimed in claim 10 wherein the second titanium nitride layer is deposited under a deposition condition wherein a ratio of $NH_3$ to $TiCl_4$ is greater than about 16.7.

13. The method as claimed in claim 10, wherein the second titanium nitride layer is deposited at a deposition pressure different from a deposition pressure for depositing the first titanium nitride layer.

14. The method as claimed in claim 13, wherein the first titanium nitride layer is deposited at a deposition pressure of about 5 torr, and the second titanium nitride layer is deposited at a deposition pressure of between about 7 torr to 10 torr.

15. The method as claimed in claim 10, wherein the second titanium nitride layer is deposited under a deposition condition wherein a distance for a deposition gas from a showerhead to reach a central portion of a wafer is longer than a distance for the deposition gas to reach an edge portion of the wafer.

16. The method as claimed in claim 10, wherein the titanium nitride layers are deposited by atomic layer deposition or chemical vapor deposition.

17. The method as claimed in claim 10, wherein the first titanium nitride layer is deposited to a thickness that is between about 50% to 90% of a total thickness of the first and second titanium nitride layers, and the second titanium nitride layer is deposited to a thickness that is between about 10% to 50% of the total thickness of the first and second titanium nitride layers.

* * * * *